United States Patent [19]

Munninghoff et al.

[11] 3,918,006

[45] Nov. 4, 1975

[54] DIGITAL FREQUENCY SYNTHESIZER INCLUDING PHASE LOCKED LOOP

[75] Inventors: Clement W. Munninghoff; Francis A. Wissel, both of Milford, Ohio

[73] Assignee: Cincinnati Electronics Corporation, Cincinnati, Ohio

[22] Filed: Sept. 27, 1974

[21] Appl. No.: 509,955

[52] U.S. Cl. .................... 331/1 A; 331/18; 331/25

[51] Int. Cl.$^2$ .................................... H03B 3/04

[58] Field of Search ........ 331/1 A, 18, 25; 325/458, 325/459

[56] References Cited

UNITED STATES PATENTS 3,713,040 1/1973 Page, Jr. ........................... 331/1 A 3,753,141 8/1973 Van Elk et al.................... 331/18 X

*Primary Examiner*—Siegfried H. Grimm

*Attorney, Agent, or Firm*—Lowe, King & Price

[57] ABSTRACT

A digital frequency synthesizer includes a variable frequency oscillator that is mechanically tuned to one mHz intervals and electronically tuned to 50 kHz intervals by a phase locked loop control voltage. The phase locked loop includes a prescaler for dividing the oscillator frequency by a first predetermined factor. A preset counter frequency divides the output of the prescaler by a second predetermined factor and controls the occurrence times of frequency divided pulses in response to the selected 50 kHz interval. A frequency divider responds to a frequency standard to derive a reference frequency equal to the 50 kHz spacing between adjacent channels divided by the frequency dividing factor of the prescaler. A gate is opened at approximately the reference frequency for a length sufficiently wide to selectively pass not more than one of the frequency divided pulses during each cycle of the reference frequency. A phase detector responds to the reference frequency and the passed pulses for deriving the control voltage for the variable frequency oscillator, whereby the variable frequency oscillator output frequency is stabilized at the selected mHz and kHz values.

14 Claims, 7 Drawing Figures

DIGITAL FREQUENCY SYNTHESIZER INCLUDING PHASE LOCKED LOOP

FIELD OF THE INVENTION

The present invention relates generally to digital frequency synthesizers and, more particularly, to a frequency synthesizer wherein a pulse derived by frequency dividing the output of a variable frequency oscillator is selectively passed once each cycle of a reference frequency to a phase detector where it is compared with a voltage of reference phase at the reference frequency.

BACKGROUND OF THE INVENTION

Analog and digital frequency synthesizers are well known to those skilled in the art. Typically, analog synthesizers include a voltage controlled oscillator, several crystal oscillators, a plurality of mixers and bandpass filters, as well as a phase discriminator for deriving an error voltage that controls the frequency of the voltage controlled oscillator. In one particular analog synthesizer that has been extensively utilized, the voltage controlled oscillator is also provided with circuitry for mechanically tuning the oscillator to relatively coarse frequency bands which are separated by 1 mHz intervals. 100 kHz intervals within each 1 mHz interval are selected by connecting one of 10 oscillators, each having a 100 kHz spacing relative to each other, in circuit with a mixer. Channels of 50 kHz intervals are selected by connecting one of two crystal oscillators, having a spacing of 50 kHz, to a circuit that is also responsive to a frequency translated replica of a sum or difference frequency derived by mixing the variable frequency oscillator output with the selected 100 kHz interval oscillator.

In contrast, typical digital synthesizers include a single frequency standard that is cojpled to a phase locked loop. The phase locked loop includes the variable frequency oscillator which drives a variable frequency divider that is exclusively responsive to input signals indicative of the desired output frequency of the variable frequency oscillator. The advantages of digital synthesizers over analog synthesizers are well known, and need not be enumerated herein.

Frequency synthesizers usually form but one part of existing electronic devices, such as receivers, transmitters, and transceivers. It is not desirable, in many instances, to completely redesign these equipments in order to provide them with digital synthesizers; in particular, it is frequently desirable to utilize the variable frequency oscillator of the existing synthesizer in connection with these equipments. Therefore, it is desirable, in certain instances, to provide a digital synthesizer that is compatible with prior art analog type variable frequency oscillators. However, the prior art analog synthesizers having coarse mechanical tuning for the variable frequency oscillator often have no ready means of providing coarse frequency information to a variable frequency divider of a digital synthesizer. In contrast, the control signals for the finer frequency intervals, e.g. 100 kHz and 50 kHz in the analog synthesizer discussed supra, are readily available for controlling the variable frequency divider because these intervals are controlled by switching different crystals into the circuit.

It is, therefore, an object of the present invention to provide a digital synthesizer that is compatible with tuned variable frequency oscillators of prior art analog synthesizers.

Another object of the invention is to provide a digital synthesizer that is compatible with a variable frequency oscillator having selectable band switching, as well as voltage frequency control within the band.

BRIEF DESCRIPTION OF THE INVENTION

In accordance with a basic concept of the present invention, frequency control of a voltage controlled oscillator is provided by selectively passing a frequency divided pulse from the output of the oscillator to a phase detector that controls the oscillator frequency. The occurrence time of the pulse is determined by the frequency channel within the selected band of the variable frequency oscillator. The pulse is gated to a phase detector for a length of time sufficiently wide to selectively pass not more than one of the frequency divided pulses during each cycle of a reference frequency; the gate occurrence time is correlated with the selected frequency band. The reference frequency is applied at reference phase to the phase detector, where it is time compared with the gated pulse. The phase detector derives an error voltage in response to the phase difference between the reference phase and the passed pulse, thereby to control the frequency of the variable frequency oscillator in accordance with the selected frequency channel within the selected band. The invention relies upon the inherent frequency stability of the variable frequency oscillator in the coarse frequency band that is usually selected by mechanical means.

The variable frequency oscillator is susceptible to operation over a very wide bandwidth; a typical example is from 41.1 to 64.9 mHz. Tuning over such a wide frequency range poses certain gating problems to enable not more than one pulse to be gated during each cycle of the reference frequency. To enable only one pulse to be gated during each cycle of the reference frequency, the gating time duration is dependent upon the selected frequency band of the variable frequency oscillator.

Ideally, frequency divided pulses are gated to the phase detector for a time interval that is exactly centered with regard to the occurrence time of a frequency divided pulse derived from the variable frequency oscillator, when the oscillator frequency is exactly in the center of the band. Such an ideal gating interval can be generated by a digital counter clocked at a very high frequency, e.g., 100 mHz for the band extending from 41.1–64.9 mHz. With current state-of-the-art circuitry, such a counting rate is not usually feasible. A more feasible counting rate is on the order of 3 mHz, which results in counting periods of 0.333 microseconds in duration. By selecting a 3 mHz counting rate, there is a displacement in the time at which the gate for the frequency divided pulse opens and closes relative to the ideal. To prevent time sliding of the gating interval, counting circuitry responsive to the frequency standard is reset once each cycle of the reference frequency applied to the phase detector.

As a further feature of the invention, a preset counter utilized to enable the frequency divided pulse to be derived at an occurrence time related to the desired fine frequency channel within the selected frequency band is periodically preset by a side step counter. The side step counter is clocked in response to frequency divided pulses derived from the variable frequency oscillator, whereby the phase detector is effectively isolated from shifting of a preset counter that controls the occurrence time of the frequency divided pulses.

It is, accordingly, a further object of the present invention to provide a new and improved very wide band digital frequency synthesizer employing a variable frequency oscillator that is tuned to different output frequencies that are discretely separated from each other and is controlled to frequencies between the discrete frequencies by a phase locked loop including a presettable counter.

Another object of the invention is to provide a digital frequency synthesizer wherein frequency divided pulses from a variable frequency oscillator are time gated to a phase detector, and the period of gating is variable, dependent upon the oscillation frequency.

A further object of the invention is to provide a digital frequency synthesizer wherein frequency divided pulses from the variable frequency oscillator are gated to a phase detector for time intervals that are not precisely centered about the same point in each cycle of a reference frequency.

The above and still further objects, features and advantages of the present invention will become apparent upon consideration of the following detailed description of one specific embodiment thereof, especially when taken in conjunction with the accompanying drawing.

DETAILED DESCRIPTION OF THE DRAWING

Figure 1:
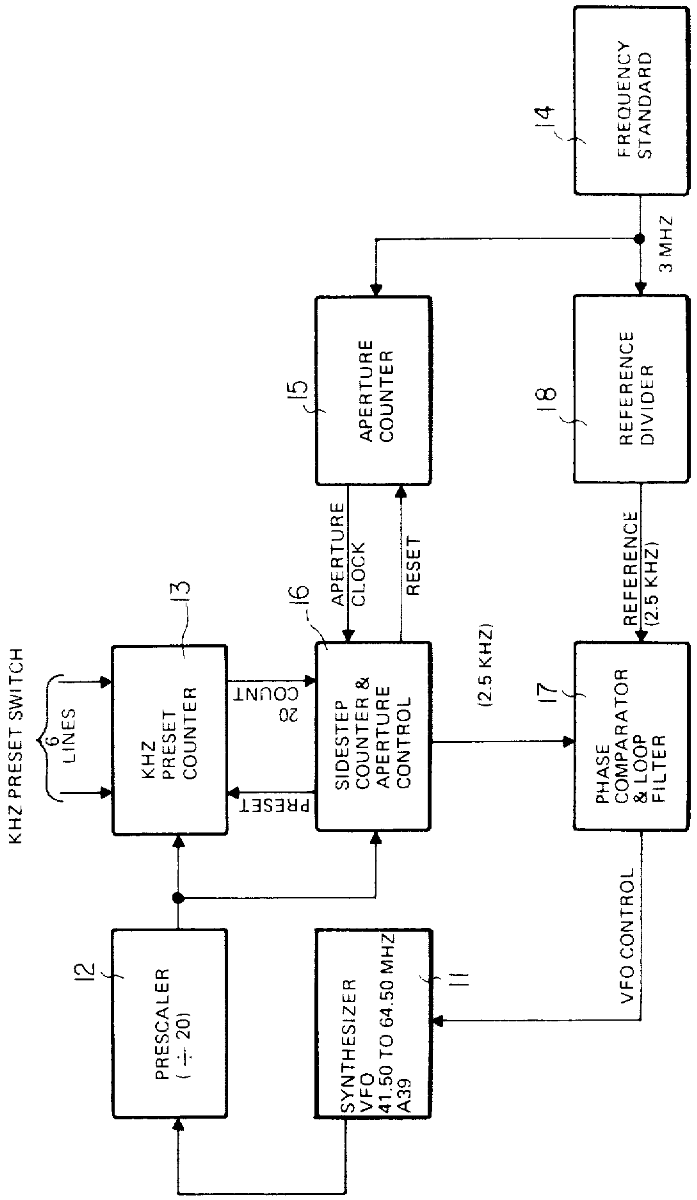
FIG. 1 is a block diagram of a preferred embodiment of the invention.

The invention is disclosed in connection with a variable frequency oscillator of the type in a transceiver known as an AN/PRC/77 which includes a variable frequency oscillator that is mechanically coarse tuned to frequency bands that are separated from each other by 1 mHz, over the interval from 41.50 to 64.50 mHz. Within each of the 1 mHz bands, the oscillator is fine tuned to one of 20 channels, each of which has a frequency separation of 50 kHz. It is to be understood that the principles of the invention are applicable to other types of variable frequency oscillators that include discrete, incremental tuning, in combination with voltage controlled tuning and that the example of the AN/PRC/77 is made to provide details of one specific embodiment of the invention.

The digital synthesizer of the present invention includes variable frequency oscillator 11 that is mechanically tuned over the range from 41.50 to 64.50 mHz at 1 mHz intervals. Tuning is accomplished by ganged air dielectric capacitors that are detented at 1 mHz intervals. Oscillator 11 is relatively stable, and derives an output frequency that is within ±400 kHz of the tuned frequency, without any feedback control. Thereby, in response to the oscillator being set at one of the discrete, incremental frequencies, there can be no overlap into a frequency of an adjacent band. However, if oscillator 11 is set at one frequency in the band, for example, 41.50 kHz, the oscillator output frequency may vary anywhere from 41.1 mHz to 41.9 mHz, if no feedback control were applied.

The output frequency of oscillator 11 is coupled to a fixed, divide-by-20, prescaler 12. The frequency divided output of prescaler 12 is coupled as a clock input to preset counter 13, which frequency divides its input signal by a further factor of 20. However, the output of counter 13 is of variable phase, at any one of the twenty possible positions of the frequency divided output of the counter. The phase of frequency divided pulses derived from counter 13 is determined by the state of a six bit binary signal supplied to the counter, and indicative of the desired frequency within the selected frequency band of variable frequency oscillator 11. The binary input signal to counter 13 establishes 20 different fine frequency channels within each frequency band of oscillator 11, wherein adjacent channels are spaced from each other by 50 kHz.

In accordance with one preferred embodiment, counter 13 is a modified Johnson type counter, that includes six stages, one of which is provided for each of the binary bits coupled to the counter. The six binary bits coupled to the counter are derived from switches (not shown) that are manually controlled by an operator; the switches are controlled from the contacts that control the connections of oscillators in the prior art analog AN/PRC/77. In response to the operator activating different combinations of the twenty possible 50 kHz increments within each 1 mHz band, twenty different combinations of signals are derived on the six input leads to counter 13. The state of the binary signal supplied to present counter 13 determines the occurrence time of the first output pulse of counter 13 after the counter has been preset. After the first output pulse from counter 13, an output pulse is derived from the counter for each 20 pulses that are supplied to the counter by prescaler 12 until the counter is again preset.

The counting sequence of preset counter 13 is given in Table 1, at the end of the present specification. An output pulse is derived from counter 13 when the counter is in state 19, and the counter is reset to zero when it is in state 20. In response to the counter 13 being supplied with a preset input, the counter is returned to a state indicated by the binary signal coupled to it. Table 1 provides a correlation between the preset count established in counter 13 by the six bit binary signal and the deviation of the output frequency of oscillator 11 relative to the coarse frequency to which the oscillator is tuned by mechanical means.

Because variable frequency oscillator 11 is tuned to frequencies that are 1 mHz apart and preset counter 13 is not supplied with any signals indicative of the mHz setting of oscillator 11, the output signal of counter 13 consists of a number of ambiguous pulses that are separated in even time increments, but which provide no information regarding the mHz setting of oscillator 11. However, the time position of one of the pulses in a complete pulse train occurs at a time which indicates, i.e., is correlated with, the mHz setting of oscillator 11. To determine the time position of the pulse derived from counter 13 which corresponds with the mHz setting of oscillator 11, counting apparatus is provided. The counting apparatus activates a gate for passing the pulse derived from counter 13 that corresponds with the mHz setting of oscillator 11.

To these ends, 3.00 mHz frequency standard 14, which is preferably a crystal oscillator or the like, is provided and drives aperture counter 15. Aperture counter 15 counts cycles of frequency standard 14 and periodically derives a gating voltage for passing the desired output pulse of counter 13. The gating voltage generally has a frequency of 2.5 kHz and a period such that not more than one output pulse of counter 13 can be passed through a gate once during a 400 microsecond interval, the period of each 2.5 kHz cycle derived from aperture counter 15.

To control the gating of the selected output pulse of counter 13, sidestep counter and aperture control circuit 16 is provided. Circuit 16 is responsive to gating pulses derived from aperture counter 15, as well as the frequency divided output pulse of counter 13 and the frequency divided output of prescaler 12. In response to a frequency divided pulse from counter 13 being coupled through a gate included in circuit 16, aperture counter 15 is reset and counter 13 is preset. Resetting counter 15 causes the counter to return to a zero state, whereby it can again count cycles of frequency standard 14 and generate the leading edge of a gate enable pulse during each 400 microsecond period of the 2.5 kHz reference frequency. Presetting counter 13 causes that counter to be reset to an initial count determined by the state of the six binary signals coupled to counter 13.

The sidestep counter of circuit 16 is clocked in response to the frequency divided output of prescaler 12. The sidestep counter in circuit 16 delays, by a predetermined time interval, the occurrence time of the frequency divided pulse of counter 13 that is passed through the gate of circuit 16. Such delay provides adequate time to preset counter 13 and reset counter 15 so that these counters are preset and reset at times different from the occurrence times of their output pulses.

The 2.5 kHz output pulse of circuit 16, having a time position indicative of the desired frequency of oscillator 11, in terms of 1 mHz band settings and 50 kHz channel settings, is coupled to one input of phase comparator and loop filter circuit 17. The other input to circuit 17 is a 2.5 kHz square wave having a reference phase. The 2.5 kHz reference phase signal applied to circuit 17 is derived by coupling the output of frequency standard 14 to divide by 1200 reference frequency divider 18.

The phase comparator in circuit 17 determines the time difference between the leading edges of the signals supplied to its two input terminals and derives an error signal directly proportional to this time difference. The error signal is coupled to the loop filter included in circuit 17. Preferably, the loop filter is an active filter that provides a Type two loop for the synthesizer. The loop filter derives a DC signal indicative of the phase difference between the two inputs to phase comparator 17. The DC signal is applied as a control voltage to variable frequency oscillator 11, whereby the oscillator frequency is locked to the frequency selected by its coarse mechanical tuning, as well as the binary signal level applied to counter 13.

The reference frequency (2.5 kHz) of the variable and fixed phase signals applied to the inputs of the phase comparator of circuit 17 equals the spacing (50 kHz) between adjacent fine channels selected by the binary input signals to counter 13 divided by the frquency division ratio (20) of prescaler 12;

$$2.5\ kHz = \frac{50\ kHz}{20}.$$

With a 2.5 kHz reference frequency, which corresponds with a repetition period of 400 microseconds, the gating pulse derived by aperture counter 15 has a center point occurring every 400 microseconds. The pulse derived from counter 15 has a length to enable not more than one pulse derived from counter 13 during each 400 microsecond period to be passed through circuit 16 to circuit 17. For any frequency to which variable frequency oscillator 11 is tuned by mechanical means, the selected pulse from counter 13 that is passed through circuit 16, relative to the first pulse during each cycle of the reference wave derived from divider 18, is determined by dividing the mechanically set frequency of oscillator 11 by the reference frequency derived from divider 18 multiplied by the frequency division factor of scaler 12. Hence, for the lowest mechanical frequency set into oscillator 11 (41.5 mHz), pulse 830 from prescaler 12 relative to the occurrence of zero phase of the 2.5 kHz reference wave is coupled through circuit 16 to circuit 17 under the control of counter 15;

$$830 = \frac{41.5\ mHz}{2500\ Hz \times 20}.$$

With oscillator 11 tuned to 41.5 mHz and a 0 kHz setting supplied to counter 13, count 830 derived from counter 13 occurs at zero phase of the reference wave applied to phase comparator 17 by divider 18. The zero phase position of the output of reference divider 18 is spaced by 400 microseconds from the previous zero phase position of the reference divider output since the reference divider output wave has a period of 400 microseconds. This relationship is indicated by B in FIG. 2, wherein count 830 has a leading pulse edge occurring at 400 microseconds from time $t_0$, the time position of zero phase of the output of reference divider 18. With oscillator 11 and counter 13 set as indicated, and as illustrated by B in FIG. 2, counts 810 and 850 derived from prescaler 12 occur at time positions of 390.355 and 409.632 microseconds after $t_0$. The gating pulse derived by aperture counter 15 prevents these two counts from being passed through circuit 16 to phase comparator 17; this is the desired result since counts 810 and 850 are at time positions representing frequencies of oscillator 11 at 40.5 mHz and 42.5 mHz.

Oscillator 11, even though mechanically tuned to 41.5 mHz and with no kHz offset factor introduced by preset counter 13, is susceptible to drifting by ± 400 kHz. The waveforms A and C in FIG. 2 indicate the time positions of counts 830 and the adjacent counts (810 and 850) derived from counter 13 on either side of count 830, as derived from counter 13, for the worst case situations of the frequency of oscillator 11 being at 41.1 and 41.9 mHz. For the low frequency worst case situation, as illustrated by A in FIG. 2, count 830 occurs at a time 403.893 microseconds removed from $t_0$, while the adjacent pulse derived from counter 13, corresponding corrsponding with count 810, has a leading edge occurring at 394.16 microseconds displaced from $t_0$. For the high frequency worst case situation, as illustrated by C in FIG. 2, count 830 is derived from counter 13 at a time 396.176 microseconds removed from $t_0$, and the next pulse derived from counter 13, corresponding with count 850, occurs at a time 405.722 microseconds removed from $t_0$.

Figure 2:
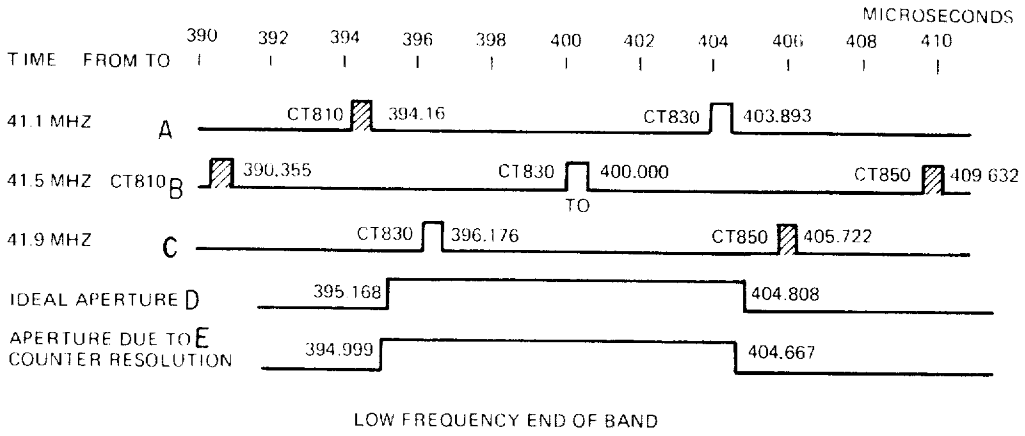
FIG. 2 is a series of waveforms of signals derived in the system of FIG. 1 under conditions at the low frequency of a synthesized band.

To pass the 830 counts, for the three described situations, to the exclusion of counts 810 and 850, aperture counter 15 ideally generates an aperture or window having leading and trailing edges respectively occurring 395.16 and 404.808 microseconds removed from $t_0$, as illustrated by D in FIG. 2. The ideal aperture cannot be generated by a digital counter unless it is clocked at a very high frequency, such as 100 mHz. Such a high frequency standard is not practical with present state-of-the-art circuitry, in combination with counting circuits. Instead, a 3.00 mHz frequency is well suited for standard 14, whereby each count of aperture counter 15 has a duration of 0.333 microseconds. Because such durations do not enable the ideal aperture D of FIG. 2 to be derived; an approximate aperature, as indicated by E in FIG. 2, is derived by aperature counter 15. The approximate aperture derived by counter 15 has leading and trailing edtes occurring at times 394.999 and 404.667 microseconds displaced from time $t_0$. The leading and trailing edges occur in time synchronism with counts 1185 and 1214 of aperture counter 15 following its last reset. Resetting of aperture counter 15 occurs in response to either a pulse being coupled through circuit 16 or counter 15 being driven to a count corresponding with the trailing edge of the waveform E in FIG. 2, whichever occurs first. In summary, not more than one frequency divided pulse derived from counter 13 can be passed through circuit 16 during each cycle of the reference wave applied by divider 18 to the phase comparator of circuit 17 during a time interval that extends for not more than 9⅔ microseconds out of each 400 microsecond period of the reference wave. The 9⅔ microsecond interval is positioned to select a pulse from counter 13 that corresponds with the mHz setting of oscillator 11.

Figure 3:
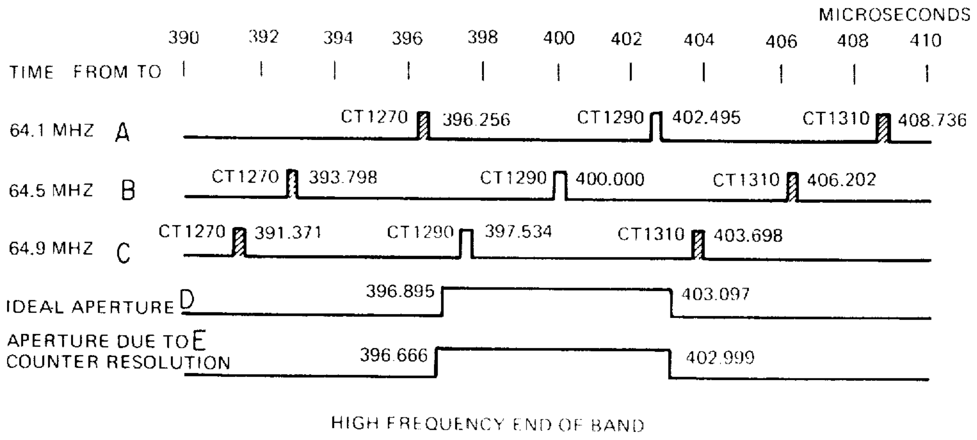
FIG. 3 is a series of waveforms of signals derived in the system of FIG. 1 under conditions at the high frequency end of a synthesized band.
Figure 4A:
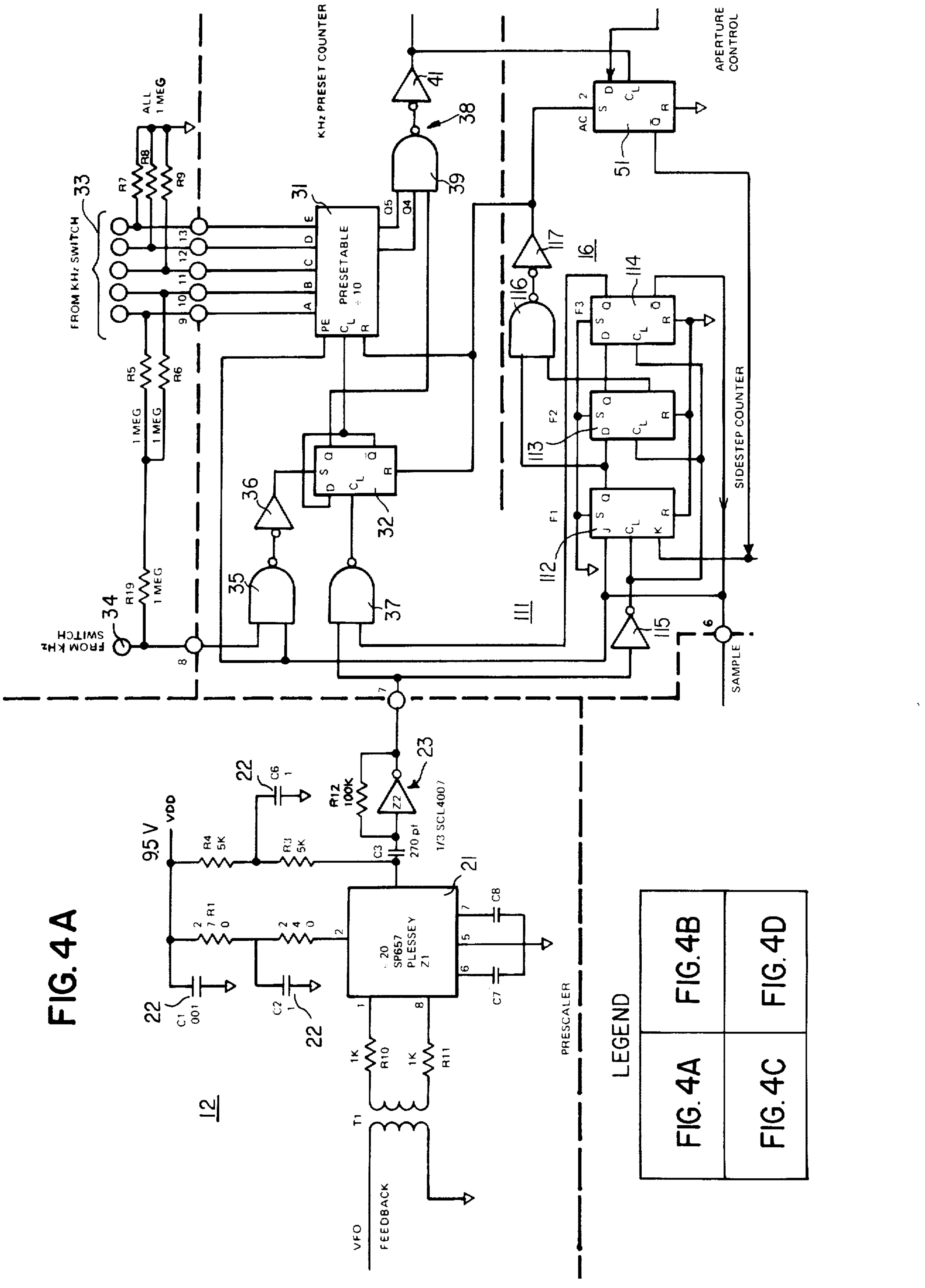
FIGS. 4A–4D, together, are a complete circuit diagram of the control apparatus of the block diagram of FIG. 1.
Figure 4B:
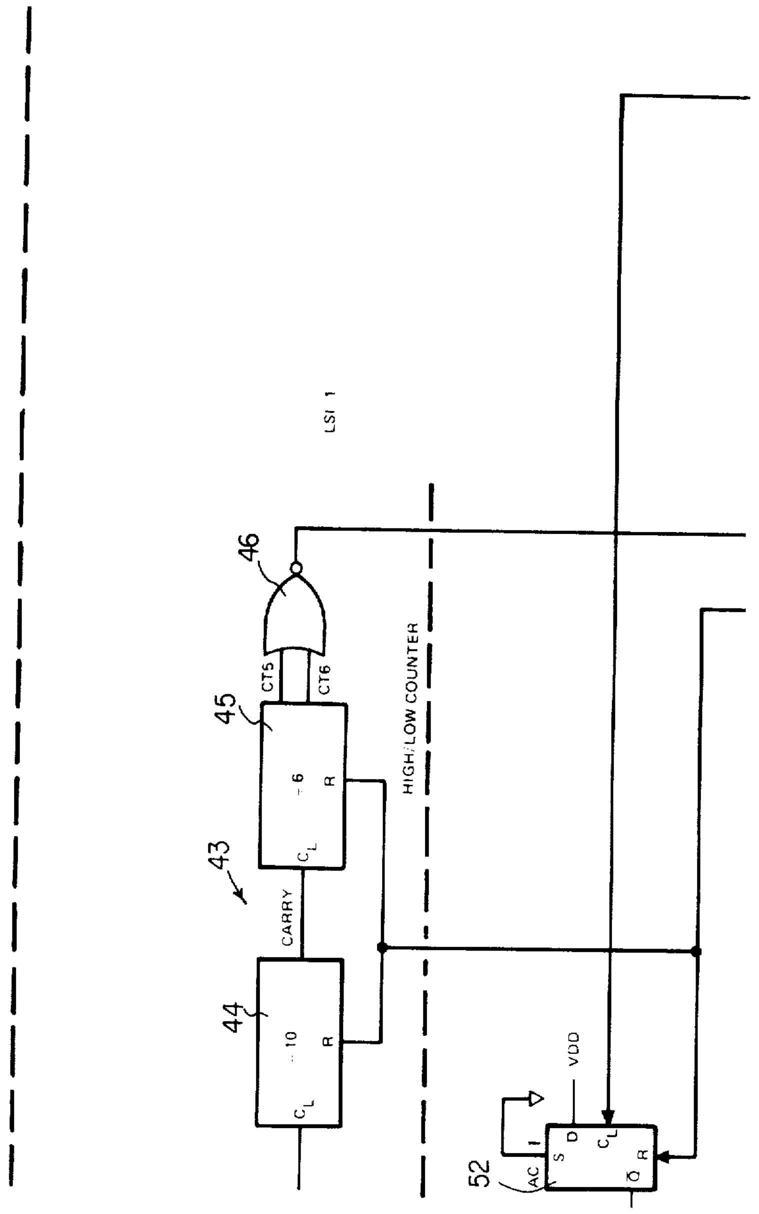
Figure 4C:
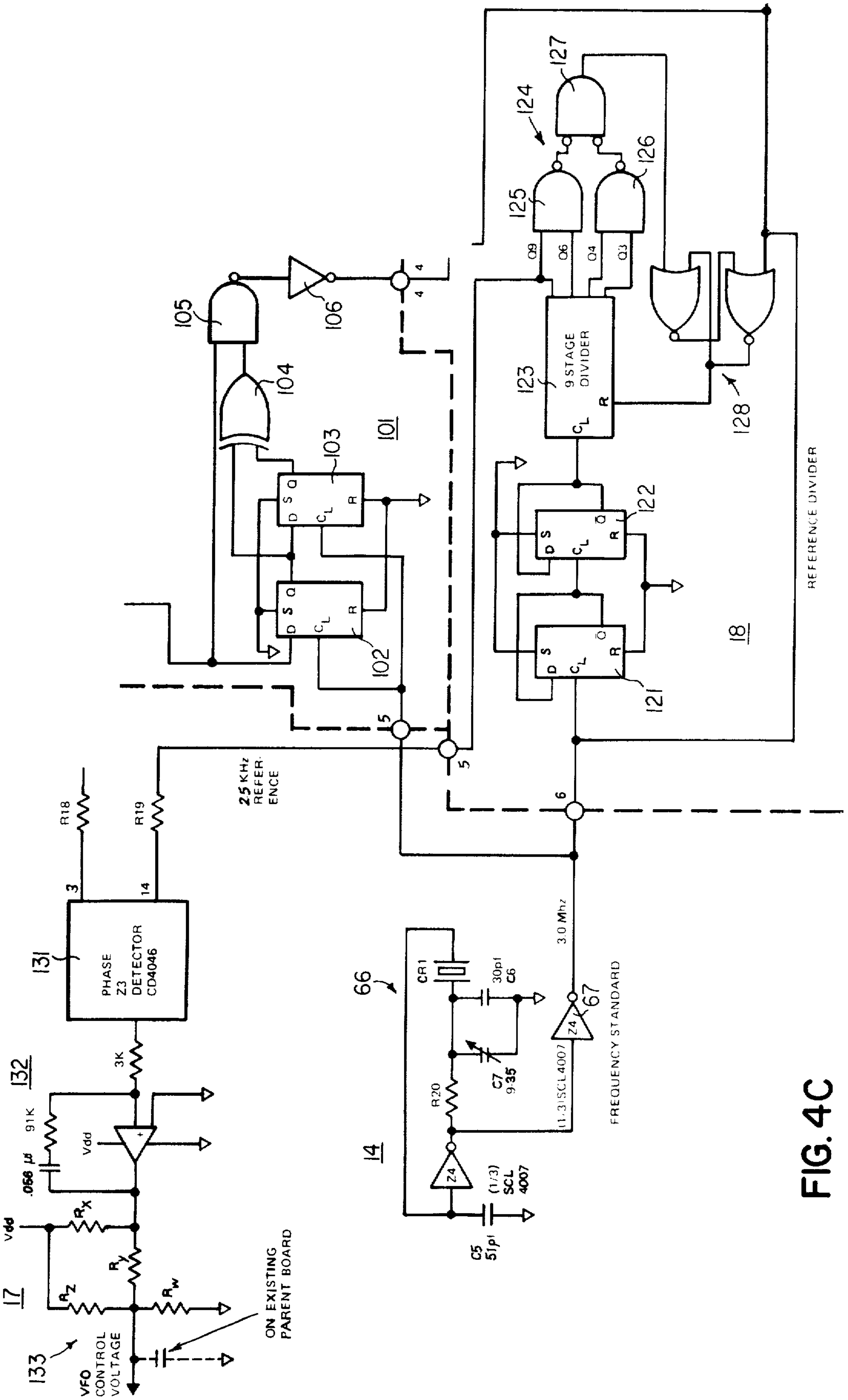
Figure 4D:
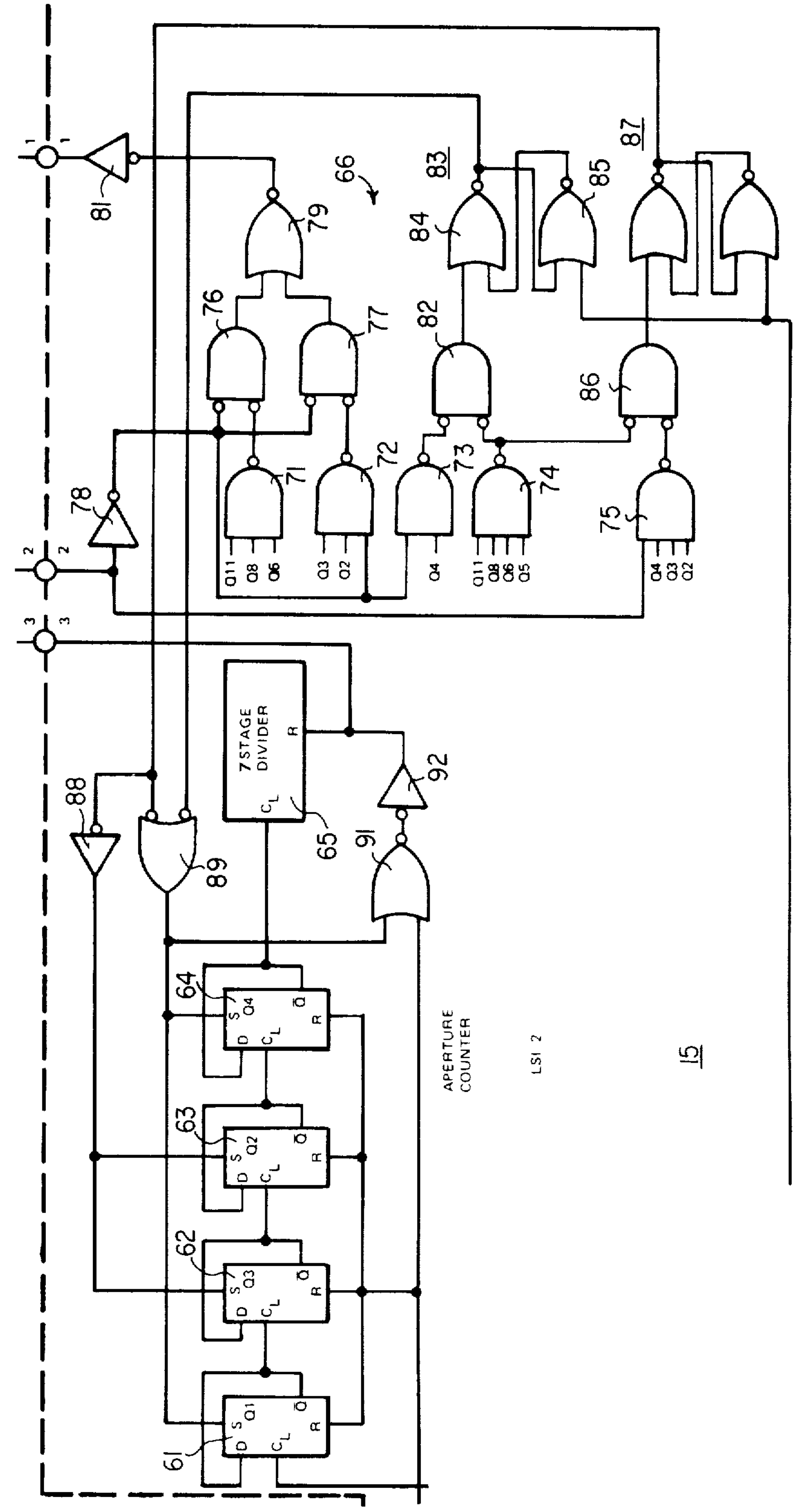

At the high end of the mHz setting of oscillator 11, as illustrated by A to E in FIG. 3, the situation is slightly different because of the closer time spacing between adjacent output pulses of counter 13. For the highest mHz setting of oscillator 11, count 1290 of prescaler 12 should be coupled as an output pulse of counter 13 through circuit 16 to the phase comparator circuit 17;

$$1290 = \frac{64.5\ mHz}{2500\ kHz \times 20}.$$

With no kHz offset introduced by counter 13 and oscillator 11 deriving its mechanically set frequency of 64.50 mHz, count 1290 occurs at a time 400 microseconds removed from $t_0$, as illustrated by B in FIG. 3B. Counts 1270 and 1310 of prescaler 12 are derived as the adjacent output pulses of counter 13, at times respectively displaced from $t_0$ by 393.798 and 406.202 microseconds. For the worst case drift of oscillator 11 in the negative frequency direction, whereby the oscillator output frequency is 64.1 mHz (as illustrated in A of FIG. 3), count 1290 occurs at a time 402.495 microseconds displaced from $t_0$, while the adjacent pulses derived from counter 13 occur at counts 1270 and 1310, times respectively displaced from $t_0$ by 396.256 and 408.736 microseconds. In contrast, for the worst high frequency drift of oscillator 11, wherein the ocsillator output frequency is 64.9 mHz, count 1290 occurs at a time 397.534 microseconds displaced from $t_0$, while counts 1270 and 1310 are respectively displaced from $t_0$ by 391.371 and 403.698 microseconds. Aperture counter 15, under this situation, ideally enables circuit 16 to pass not more than one output pulse of counter 13 to phase comparator 17 during each 400 microsecond period of the reference wave derived from divider 18.

To these ends, the output pulse of counter 13 ideally should be capable of being passed through circuit 16 during a time window extending from 396.895 to 403.097 microseconds from $t_0$. Because frequency standard 14 generates an output wave of 3.00 mHz, such an ideal window is not possible, and the window actually extends between 396.666 and 402.999 microseconds from $t_0$, as illustrated by E in FIG. 3. The leading and trailing edges of the window correspond with aperture counter 15 counting 1190 and 1209 cycles of frequency standard 14 since the last time the aperture counter was reset.

The duration of the window for the high frequency situation illustrated in FIG. 3 is 6⅓ microseconds, in contrast to the 9⅔ microsecond duration illustrated for the low frequency situation of FIG. 2. This change in window duration is necessary because of the closer spacing of adjacent pulses derived from counter 13 for the high frequency situation, and to enable all possible pulses which accurately represent the mHz position of oscillator 11 to be coupled to circuit 17 for the low frequency situation. As described infra, aperture counter 15 includes circuitry for detecting whether the output frequency of oscillator 11 is equal to or greater than 50 mHz to enable the two different length windows to be derived. A switchover point at 50 mHz, rather than the ideal switchover at 53 mHz, in the center of the frequency range of oscillator 11, was selected because of the relative ease of detecting 50 mHz compared to 53 mHz.

Reference is now made to FIGS. 4A–4D of the drawing wherein there are illustrated circuit diagrams for prescaler 12, preset counter 13, circuits 16 and 17, aperture counter 15, frequency standard 14 and reference divider 18.

Prescaler 12 preferably includes a bipolar transistor divide by 20 frequency divider integrated circuit 21, as is available from Plessey, Type SP657. Divider circuit 21 is transformer coupled to the output of variable frequency oscillator 11 and is designed for a sinewave input. The output of frequency divider 21 is a square wave having a frequency 1/20th that of the output frequency of variable frequency oscillator 11. To prevent high frequency components in the pulses developed by frequency divider 21 from adversely affecting the DC power supply for the remainder of the circuitry, the frequency divider power supply and output are connected to the DC power supply via filter capacitors 22. Frequency divider 21 derives a square wave output that is converted into pulses that are time synchronized with the positive going leading edge of each square wave by differentiating circuit 23.

Pulses derived from prescaler 12 are supplied to preset counter 13. Preset counter 13 includes an integrated circuit, presettable divide by ten Johnson counter 31 having a clock input terminal responsive to an output signal of flip-flop 32. Integrated circuit 31 includes five input terminals A–E which are respectively responsive to the five binary bits representing the five highest orders of the kHz preset code, as coupled to leads 33. The lowest order bit of the preset kHz code is coupled to a set input of flip-flop 32 from terminal 34 via NAND gate 35 and inverter 36. The binary signal bit applied to terminal 34 is represented in Table 1 by the columns marked ÷2 and $Q_0$, while the binary states of the input bits supplied to leads 33 are represented by the columns A–E and $Q_1$–$Q_5$. Flip-flop 32 includes a clock input terminal responsive to pulses derived from prescaler 12, as selectively coupled to the clock input via NAND gate 37.

To detect when the counter including integrated circuit 31 and flip-flop 32 has been driven to state 19, decoding circuit 38 is provided. Decoding circuit 38 includes NAND gate 39 having inputs responsive to the set (Q) output of flip-flop 32 and outputs of the last two stages ($Q_4$ and $Q_5$) of integrated circuit 31. The output of NAND gate 38 is coupled to inverter 40 which derives a binary one level only while the counter including circuit 31 and flip-flop 32 is at count 19.

The spacing between adjacent pulses derived from inverter 41 is equal to the time required for 1 million cycles of the output of variable frequency oscillator 11. The output pulses of inverter 41 thereby enable the length of the aperture to be easily controlled. In response to less than 50 pulses being derived from inverter 41 since the last time the counter including circuit 31 and flip-flop 32 was reset, the aperture length is 9⅔ microseconds; in response to in excess of 49 pulses being derived from inverter 41 since the last resetting of the counter, the aperture is set to 6⅓ microseconds. To control the aperture length, high-low counter 43 is provided.

High-low counter 43 includes two serially connected frequency dividers 44 and 45, respectively having frequency division factors of ten and six. Counter 44 includes a clock input terminal directly responsive to the output of inverter 41 and a carry output terminal which is connected to a clock input terminal of counter 45. To determine a transition from a count of 49 to a count of 50 in the state of counter 43, and thereby indicative of a transition from 49 million cycles to 50 million cycles of the output of oscillator 11 since the last resetting of the counter including circuit 31 and flip-flop 32, the next to last and last stages of counter 45 are connected to NOR gate 46. Thereby, NOR gate 46 derives a binary one output in response to less than 50 million cycles being derived from oscillator 11 since the last time the counter including circuit 31 and flip-flop 32 was reset and a binary zero output in response to 50 million or more cycles having been derived from the oscillator since the last reset.

Aperture control is provided by coupling each output pulse of inverter 41 to a clock input of D flip-flop 51 included in the aperture control portion of circuit 16. Flip-flop 51 includes a D input terminal responsive to the complementary output terminal ($\bar{Q}$) of D flip-flop 52. Flip-flop 52 includes a clock input terminal ($C_L$) responsive to an output pulse of aperture counter 15, as well as a reset input terminal (R) responsive to an output of aperture counter 15. In response to aperture counter 15 indicating that prescaler 12 has reached a count of 1185 or 1190, depending upon the state of the output of NOR gate 46, a pulse is applied to the clock input of flip-flop 52 and a binary one level is applied to the D input terminal of flip-flop 51. The binary one input is applied to the D input terminal of flip-flop 51 by the output of flip-flop 52 until aperture counter 15 indicates prescaler has reached a count of either 1214 or 1209, depending upon the state of the output of inverter 46. In response to a count of 1214 or 1209 being reached, the aperture counter applies a pulse to a reset input terminal of flip-flop 52, whereby the binary one level on the D input terminal of flip-flop 51 is removed. If, during the interval while a binary one input is supplied to the D input terminal of flip-flop 51, a pulse is derived from inverter 41, the state of flip-flop 51 is changed, as monitored at the complementary ($\bar{Q}$) output terminal of flip-flop 51. Hence, the output pulse of inverter 41 can be coupled through flip-flop 51 only if it is in time coincidence with the aperture gating voltage which is, in essence, derived from the $\bar{Q}$ output terminal of flip-flop 52.

Aperture counter 15 is in an eleven stage counter, including four cascaded D flip-flops 61–64 and seven stage integrated circuit frequency divider 65. Each of the seven stages of divider 65 has a separate output terminal on which is derived a binary signal, represented by $Q_5$–$Q_{11}$, while the output signals of flip-flops 61–64 are rpresented by $Q_1$–$Q_4$. Each of flip-flops 61–64 includes a clock input terminal ($C_L$), with the clock input terminal of flip-flop 61 being connected to be responsive directly to the 3.00 mHz signal derived from frequency standard 14, which is preferably a crystal oscillator 66 driving a shaping amplifier 67 that converts a sine wave output of the oscillator into square waves. Binary output signals of flip-flops 62–64 and of the first, second, fourth and seventh stages of divider 65 are coupled to a decoding network 66 to enable the counts indicative of the leading and trailing edges of the aperture to be detected. Decoding network 66 actually responds to counts of aperture counter that are 1185, 1190, 1213 and 1208 because there is a one pulse delay in circuitry for resetting the counter including flip-flops 61–64 and divider 65.

Decoder 66, in addition to including the normal NAND gates for decoding the values of 1184, 1213, 1189, and 1208, includes circuitry for detecting the level of the output signal of NOR gate 46. In particular, NAND gates 71–75 respond directly to the output signals of flip-flops 61–64 and divider 65; of these gates, NAND gate 75 is directly responsive to the output of NOR gate 46, while NAND gates 72 and 73 are responsive to the complement of the output of NOR gate 46, as derived from inverter 78. Thereby, NAND gates 71 and 74 are responsive to the state of the aperture counter regardless of the condition of the output of inverter 46, and the presence or absence of a binary one at the outputs of NAND gates 72, 73 and 75 is dependent upon whether 50 million cycles or more of oscillator 11 have been derived since the last time the counter including circuit 31 and flip-flop 32 was reset. NAND gates 71 and 72 respectively drive NAND gates 76 and 77; NAND gate 76 is also responsive to the output of inverter 78. Thereby, NAND gates 72, 73 and 76 are disabled when at least 50 million cycles of oscillator 11 have been derived, while NAND gate 75 is disabled only when less than 50 million cycles of the oscillator have been derived.

To initiate the aperture, the outputs of NAND gates 76 and 77 are coupled through NOR gate 79 and inverter 81 to the clock input terminal ($C_L$) of flip-flop 52 to cause the flip-flop to be set to a binary one state in response to count 1184 or 1189 being achieved, depending upon the state of the output of NOR gate 46. To terminate the aperture, the output signals of NAND gates 73 and 74 are combined in NAND gate 82 which drives one input of latching flip-flop 83 (including cross-coupled NOR gates 84 and 85) that is also responsive to the 3.00 mHz output of frequency standard 14; also, the output signals of NAND gates 74 and 75 are combined in NAND gate 86, which drives one input of latching flip-flop 87, having a second input responsive to the output of frequency standard 14.

The aperture counter including flip-flops 61–64 and divider 65 is selectively reset to counts of zero, nine and fourteen. To reset the aperture counter to nine and fourteen, the output of flip-flop 87 is coupled through inverter 88 to input terminals of flip-flops 62 and 63 and the outputs of flip-flops 83 and 87 are combined in NOR gate 89 which drives the set input terminals of flip-flops 61 and 64. The output of NOR gate 89 also drives one input of NOR gate 91, having an output which drives inverter 92, that in turn is coupled to reset input terminals (R) of dividers 44, 45 and 65, and flip-flop 52. Thereby, high-low counter 43, divider 65 and flip-flop 52 are reset in response to aperture counter 15 reaching a count of 1209 or 1214.

If a pulse is derived from inverter 41 after a pulse is applied to the clock input of flip-flop 52, but before a pulse is supplied to the reset input of the flip-flop from NOR gate 89, aperture counter 15 is reset to zero in response to the change in state of the $\bar{Q}$ output of flip-flop 51. Counter 15 is reset to a zero state by feeding the output of flip-flop 51 to a logic network 101 included in circuit 16, which network is also responsive to the 3.00 mHz output of frequency standard 14. Aperture counter 15 is reset to a count of nine or fourteen only if successive pulses are applied to the clock and reset inputs of flip-flop 52 while no pulse is supplied to the clock input of flip-flop 51 from inverter 41. Counter 15 is selectively set to a count of nine or fourteen to compensate for the time used in keeping the window open beyond 400 microseconds; if the frequency of oscillator 11 is less than 50 mHz, counter 15 is reset to fourteen; for oscillator frequencies equal to or greater tuan 50 mHz, counter 15 is reset to nine. Logic circuit 101 includes D flip-flops 102 and 103, each of which has a clock input terminal ($C_L$) driven by the output of frequency standard 14. Flip-flop 102 includes a D input terminal responsive to the $\bar{Q}$ output of flip-flop 51, while flip-flop 103 had a D input terminal responsive to the principal output (Q) of flip-flop 102. The principal outputs of flip-flops 102 and 103 are combined in EXCLUSIVE OR gate 104, having an output which drives NAND gate 105, which is also responsive to the $\bar{Q}$ output of flip-flop 51. The output of NAND gate 105 drives the reset inputs of flip-flops 61–64 and divider 65 via inverter 106, with coupling from inverter 106 to the reset input of divider 65 being via NOR gate 91 and inverter 92.

To provide time for presetting circuit 31 and flip-flop 32 of preset counter 13, sidestep counter 111 is provided. Sidestep counter 111 includes J–K flip-flop 112 and cascaded D flip-flops 113 and 114. Each of flip-flops 112–114 includes a clock input terminal responsive to the output of prescaler 12, as coupled through inverter 115. The principal output terminal (Q) of flip-flop 112 is coupled directly to the D input terminal of flip-flop 113, having a principal output terminal (Q) connected directly to the D input terminal of flip-flop 114. The principal output terminal (Q) of flip-flop 114 is coupled as one input to NAND gate 37 to control the gating of pulses from prescaler 12 to the first stage (flip-flop 32) of preset counter 15. Flip-flop 114 includes a complementary output terminal ($\bar{Q}$) on which is derived a signal that is one of the inputs to phase detector 131 included in circuit 17. The leading edge of the $\bar{Q}$ output of flip-flop 114 has a time position which is compared in phase detector 131 with the reference phase position of the 2.5 kHz reference wave. The leading edge of the $\bar{Q}$ output of flip-flop 114 also is supplied to the J input terminal of flip-flop 112.

Flip-flops 112–114 thereby form a three stage Johnson type counter which is held in the set condition until the counter is enabled by an aperture control pulse derived from the $\bar{Q}$ output of flip-flop 51. The pulse from prescaler 12 immediately following enabling of the Johnson counter resets the first state 112 of the counter. The following two pulses from prescaler 12 respectively reset flip-flops 113 and 114 so that the leading edge of the $\bar{Q}$ output of flip-flop 114 is derived. In response to the leading edge of the $\bar{Q}$ output of flip-flop 114, NAND gate 37 is disabled and the counter including circuit 31 and flip-flop 32 is preset. The counter is preset by coupling the leading edge of the $\bar{Q}$ output of flip-flop 114 to a preset input terminal (PE) of circuit 31 and to the set input terminal of flip-flop 32; the set input terminal of flip-flop 32 is connected to the $\bar{Q}$ output of flip-flop 114 via NAND gate 35 and inverter 36.

In response to the next, i.e., fourth pulse from prescaler 12, flip-flop 112 is set and a reset pulse for circuit 31 and flip-flop 32 is derived simultaneously with flip-flop 51 being set. To these ends, the principal and complementary output terminals of flip-flops 112 and 113 are connected to NAND gate 116, having an output which drives the reset terminals of circuit 31 and flip-flop 32 and the set input terminal of flip-flop 51 via inverter 117. The following two pulses from prescaler 12 set flip-flops 113 and 114, thereby terminating and removing the preset pulse from the preset input of circuit 31 and NAND gate 35, whereby any change that occurs in the kHz setting during the next 400 microseconds has no effect on the state of the preset counter. Also, preset counter 13 is enabled by restoring the signal level at the principal output of flip-flop 114 to a binary one level, thereby enabling pulses to be coupled from prescaler 12 through NAND gate 37 to the clock input of flip-flop 32.

Reference divider 18 includes a pair of cascaded D flip-flops 121 and 122, the first of which includes a clock input terminal ($C_L$) responsive to the output pulses of frequency standard 14. Flip-flop 122 includes a complementary output terminal ($\bar{Q}$) which is coupled to a clock input of nine stage frequency divider 123, the stages of which are represented by $Q_1$–$Q_9$. Signals from stages 3, 4, 6 and 9 of divider 123 are coupled to a decoding circuit 124 including three NAND gates 125, 126 and 127. The output of decoder 124, at the output terminal of NAND gate 127, is coupled to one input of latching flip-flop 128, having a second input responsive to the output pulses of frequency standard 14. The output of latching flip-flop 128 is coupled to the reset (R) input of divider 123. The circuit configuration enables a pulse to be derived from the ninth stage of divider 123 once every 1200 cycles of frequency standard 14. The pulse has a repetition frequency of 2.5 kHz and a reference phase; the leading edge of the pulse is compared in time with the leading edge of the pulse derived from the $\bar{Q}$ output terminal of flip-flop 114.

Phase detector 131, preferably an RCA type CD4046 edge comparator, in phase comparator and loop filter circuit 17 compares the occurrence times of the leading edges of the pulses derived from sidestep counter 111 and the ninth stage of divider 123. Phase detector 131 derives a DC analog voltage having a magnitude directly proportional to the time difference between the leading edges of the pulses applied to it. The analog voltage is applied to active, analog integrator 132, the output of which drives a passive integrator 133 to form a type two loop. The output voltage developed across passive integrator 133 is coupled as a control voltage to the input of variable frequency oscillator 11.

While there has been described and illustrated one specific embodiment of the invention, it will be clear that variations in the details of the embodiment specifically illustrated and described may be made without departing from the true spirit and scope of the invention as defined in the appended claims.

Table 1.

PRESET CODE FOR JOHNSON TYPE COUNTER

| | Count | | | | | | | | Preset | | | | | | ΔFrequency From mHz Setting of VCO |
|---|---|---|---|---|---|---|---|---|---|---|---|---|---|---|---|
| | ÷2 Q0 | A Q1 | B Q2 | C Q3 | D Q4 | E Q5 | CT | | ÷2 | A | B | C | D | E | |
| Reset | 0 | 0 | 0 | 0 | 0 | 0 | 20 | | 0 | 0 | 0 | 0 | 0 | 1 | .95 |
| | 1 | 0 | 0 | 0 | 0 | 0 | 1 | | 1 | 0 | 0 | 0 | 0 | 1 | .9 |
| | 0 | 1 | 0 | 0 | 0 | 0 | 2 | | 0 | 0 | 0 | 0 | 0 | 0 | .85 |
| | 1 | 1 | 0 | 0 | 0 | 0 | 3 | | 1 | 0 | 0 | 0 | 0 | 0 | .80 |
| | 0 | 1 | 1 | 0 | 0 | 0 | 4 | | 0 | 1 | 0 | 0 | 0 | 0 | .75 |
| | 1 | 1 | 1 | 0 | 0 | 0 | 5 | | 1 | 1 | 0 | 0 | 0 | 0 | .7 |
| | 0 | 1 | 1 | 1 | 0 | 0 | 6 | | 0 | 1 | 1 | 0 | 0 | 0 | .65 |
| | 1 | 1 | 1 | 1 | 0 | 0 | 7 | | 1 | 1 | 1 | 0 | 0 | 0 | .6 |
| | 0 | 1 | 1 | 1 | 1 | 0 | 8 | | 0 | 1 | 1 | 1 | 0 | 0 | .55 |
| | 1 | 1 | 1 | 1 | 1 | 0 | 9 | | 1 | 1 | 1 | 1 | 0 | 0 | .5 |
| | 0 | 1 | 1 | 1 | 1 | 1 | 10 | | 0 | 1 | 1 | 1 | 1 | 0 | .45 |
| | 1 | 1 | 1 | 1 | 1 | 1 | 11 | | 1 | 1 | 1 | 1 | 1 | 0 | .4 |
| | 0 | 0 | 1 | 1 | 1 | 1 | 12 | | 0 | 1 | 1 | 1 | 1 | 1 | .35 |
| | 1 | 0 | 1 | 1 | 1 | 1 | 13 | | 1 | 1 | 1 | 1 | 1 | 1 | .3 |
| | 0 | 0 | 0 | 1 | 1 | 1 | 14 | | 0 | 0 | 1 | 1 | 1 | 1 | .25 |
| | 1 | 0 | 0 | 1 | 1 | 1 | 15 | | 1 | 0 | 1 | 1 | 1 | 1 | .2 |
| | 0 | 0 | 0 | 0 | 1 | 1 | 16 | | 0 | 0 | 0 | 1 | 1 | 1 | .15 |
| | 1 | 0 | 0 | 0 | 1 | 1 | 17 | | 1 | 0 | 0 | 1 | 1 | 1 | .10 |
| | 0 | 0 | 0 | 0 | 0 | 1 | 18 | | 0 | 0 | 0 | 0 | 1 | 1 | .05 |
| | 1 | 0 | 0 | 0 | 0 | 1 | 19 | Output Pulse | 1 | 0 | 0 | 0 | 1 | 1 | .00 |
| | 0 | 0 | 0 | 0 | 0 | 0 | 20 | | | | | | | | |

What is claimed is:

1. A digital frequency synthesizer comprising a voltage controlled oscillator covering a number of frequency bands, means for selecting one of said bands, said oscillator being voltage controlled within each of said bands, a phase locked loop responsive to the frequency derived by the oscillator for deriving a control voltage for enabling the oscillator to derive a selected frequency channel within the selected band, said phase locked loop including: a prescaler for dividing the oscillator frequency by a first predetermined factor, preset counter means for frequency dividing the frequency derived from the prescaler by a second predetermined factor and for controlling the occurrence time of frequency divided pulses in response to the selected frequency channel, a frequency standard, frequency divider means responsive to the frequency standard for deriving a wave having a reference phase and a reference frequency equal to the spacing between adjacent channels divided by the first factor, means responsive to the frequency standard for deriving a gating signal having a frequency approximately equal to the reference frequency and a length sufficiently wide to enable not more than one of the frequency divided pulses to be passed during each cycle of the reference frequency, gate means responsive to the gating voltage and the frequency divided pulses, and phase detector means responsive to the reference frequency and the passed pulses for deriving the control voltage.

2. The digital frequency synthesizer of claim 1 further including means for changing the length of the gating signal in response to the selected frequency band.

3. The digital frequency synthesizer of claim 2 wherein said changing means includes means for effectively counting the number of cycles of the oscillator.

4. The digital frequency synthesizer of claim 1 further including means for deriving a control signal in response to completion of the gating signal or the frequency divided pulse being passed, whichever occurs first, means for activating the preset counter means to a count determined by the selected channel in response to the control signal.

5. The digital frequency synthesizer of claim 4 wherein the means for deriving the gating signal includes further counter means responsive to the frequency standard, and means for resetting the further counter means in response to the control signal.

6. The digital frequency synthesizer of claim 1 further including means for deriving a control signal in response to completion of the gating signal or the frequency divided pulse being passed, whichever occurs first, and wherein the means for deriving the gating signal includes further counter means responsive to the frequency standard, and means for resetting the further counter means in response to the control signal.

7. The digital frequency synthesizer of claim 6 further including additional counting means responsive to the preset counter means, means responsive to the control signal for resetting the additional counting means, decoding circuitry responsive to the further counting means for deriving the gating signal while the further counting means is between a pair of counts, and means responsive to the additional counting means for changing the pair of counts to which the decoding means is responsive.

8. The digital frequency synthesizer of claim 1 further including means for deriving a control signal in response to completion of the gating signal or the frequency divided pulse being passed, whichever occurs first, and means for controlling the occurrence time, relative to the control signal being derived, and duration of the gating signal in response to the count of the additional counting means.

9. A digital frequency synthesizer comprising a voltage controlled oscillator, a phase locked loop responsive to the frequency derived from the oscillator for deriving a control voltage for enabling the oscillator to derive a selected frequency channel, said phase locked loop including: phase detector means for deriving the control voltage, frequency divider means responsive to the oscillator frequency for frequency dividing the oscillator frequency and for deriving a frequency divided output pulse having an occurrence time determined by the selected channel, means for deriving a wave having a reference phase and a reference frequency equal to a multiple of the frequency spacing between adjacent channels, said phase detector means being responsive to the reference frequency, and means synchronized with the reference wave for enabling not more than one frequency divided pulse to be passed to the phase detector means during each cycle of the reference frequency.

10. A digital frequency synthesizer for deriving a predetermined one of a plurality of frequency channels within a frequency band, said synthesizer being capable of covering a number of said bands, comprising a voltage controlled oscillator settable to said bands, means for activating the oscillator so that it has an output frequency in a selected one of said bands, said oscillator being voltage controlled within each of said bands, frequency divider means responsive to the oscillator frequency for frequency dividing the oscillator frequency and for deriving frequency divided output pulses having occurrence times determined by the selected channel, the spacing between adjacent ones of said output pulses being equal to the time required for the oscillator to derive a number of cycles equal to the frequency spread of each of said bands, means for gating only the output pulse having an occurrence time correlated with the preselected band, means for deriving a control voltage for the oscillator frequency in response to the time position of the gated output pulse, and means for controlling the oscillator frequency to the selected channel within the selected band in response to the control voltage.

11. The digital frequency synthesizer of claim 10 wherein the frequency spread of each of said bands is the same.

12. The digital frequency synthesizer of claim 10 wherein said means for gating includes means for deriving a gating window having a length sufficient to pass not more than one frequency divided pulse.

13. The digital frequency synthesizer of claim 12 further including means for changing the length of the window in response to the selected frequency band.

14. The digital frequency synthesizer of claim 13 wherein said changing means includes means for effectively counting the number of cycles of the oscillator.

* * * * *